United States Patent [19]
Doi et al.

[11] Patent Number: 4,983,965
[45] Date of Patent: Jan. 8, 1991

[54] DEMODULATION APPARATUS

[75] Inventors: Nobukazu Doi, Hachioji; Morishi Izumita, Inagi; Seiichi Mita, Kanagawa; Yoshizumi Eto, Sagamihara, all of Japan

[73] Assignee: Hitachi, Ltd., Tokyo, Japan

[21] Appl. No.: 444,845

[22] Filed: Dec. 4, 1989

[30] Foreign Application Priority Data

Dec. 9, 1988 [JP] Japan .................. 63-309881

[51] Int. Cl.$^5$ .................. H03M 5/14; H03M 9/00
[52] U.S. Cl. .................. 341/72; 341/100
[58] Field of Search .................. 341/72, 100, 95; 375/110, 111; 329/145

[56] References Cited

U.S. PATENT DOCUMENTS

| | | | |
|---|---|---|---|
| 4,027,335 | 5/1977 | Miller | 360/40 |
| 4,456,884 | 6/1984 | Yarborough, Jr. | 341/72 |
| 4,533,958 | 8/1985 | Herget | 341/95 X |
| 4,620,311 | 10/1986 | Schouhamer | 341/95 X |
| 4,675,652 | 6/1987 | Machado | 341/100 X |

FOREIGN PATENT DOCUMENTS 0019507 2/1981 Japan .................. 341/72
0106222 7/1982 Japan .................. 341/72

OTHER PUBLICATIONS

Wood, Roger, "Viterbi Reception of Miller-Squared Code on a Tape Channel", Video and Data Recording Report, IRE, 1982, pp. 1-11.
Periodical of the Institute of Television Engineers of Japan, vol. 35, No. 7, 1981, pp. 546-548.

*Primary Examiner*—William M. Shoop, Jr.
*Assistant Examiner*—Sharon D. Logan
*Attorney, Agent, or Firm*—Antonelli, Terry, Stout & Kraus

[57] ABSTRACT

An original digital signal is converted into either a Miller-squared code signal or a Miller code signal, and undergoes serial-to-parallel conversion to produce n-phase signals (where n is desired to be a positive even number). N-phase virtual demodulated signals are simultaneously generated at clock timing having a period equivalent to 1/n times the period of the transmission clock. Out of the n-phase virtual demodulated signals, n/2 phases are selected to undergo parallel-to-serial conversion, the original digital signal being thus obtained.

6 Claims, 4 Drawing Sheets

DEMODULATION APPARATUS

BACKGROUND OF THE INVENTION

The present invention relates to a demodulation apparatus, and in particular to a demodulation apparatus for converting either a Miller-squared code signal (Miller$^2$ signal) or the Miller code signal (modified FM (MFM) signal), which has been obtained by converting an original digital signal, into the original digital signal.

When a digital signal is to be transmitted (or recorded), it is necessary to convert (modulate) it into a digital signal having a form suited to the transmission channel (recording medium). As a signal having the above described form suited to the transmission channel, a signal with the DC component removed is known. As a signal wherefrom timing (clock) information can be easily extracted when the signal has been transmitted (recorded), the Miller-squared code signal and the Miller code signal are known.

The Miller code signal is a binary signal obtained by inverting the polarity of a serial binary signal, which is an original digital signal, at the center of the interval of each bit "1" and at a boundary between bits in case bits "0" continue.

Further, DC balance of the Miller code signal has been further improved in the Miller-squared code signal. When the original digital signal has an even number of consecutive "1"s between "0"s located at both ends, polarity inversion at the interval center of the last "1" is inhibited in case of the Miller-squared code signal.

As simple configuration of a demodulation circuit for converting the Miller-squared code signal into the original digital signal, a circuit as shown in FIG. 1 is known ("Video and Data Recording Report", 1982 IRE). As shown in FIG. 2, an original digital signal a' is modulated to produce a Miller-squared code signal b', which is then transmitted (or recorded).

The above described Miller-squared code signal b' is affected by noises. A resultant received (or reproduced) signal c' is converted to a digital signal e' in a binary decision circuit 1 in synchronism with a transmission (or recording/reproducing) clock d' and then supplied to a shift register 2 comprising four latches. The shift register 2 shifts the digital signal e' in synchronism with the transmission clock d'. On the basis of data A, B and C stored in the shift register 2, a logic circuit 3 derives a virtual demodulated signal f' by using a logic expressing shown within the logic circuit 3. At intervals of half a period of the data clock, the virtual demodulated signal f' generates a logic value "1" or "0" equivalent to the original digital signal. The virtual demodulated signal f' is supplied to a latch 4 and latched at timing of a data clock g'. Thereafter, demodulated data h' is outputted. Although two phases g' and g" of the data clock can be considered as the phase of the data clock, proper demodulation is performed by either one of them. Therefore, a proper data clock must be selected. This is uniquely defined by detecting the phase of a specific pattern i' contained in the digital signal e' such as (0111110) in a phase detector circuit 5. This is because there is fixed relationship between the phase of start of the specific pattern and the phase of the data clock. Assuming that one clock period of the original digital signal is T in case of a Miller-squared code signal, the specific pattern may have a period of 2T, 2.5T or 3T. In this example, 2.5T is adopted for the specific pattern. In FIG. 2, g' is selected as the data clock. In case the specific pattern i' is displaced before or after by one transmission clock, however, proper demodulation cannot be performed unless g" is selected as the phase of the data clock. How to define the phase of the data clock is described in detail in U.S. Pat. No. 4,027,335, for example, and is not directly related to the present invention. Therefore, its detailed description will be omitted.

In case the transmission digital signal a' is high in speed in the above described conventionally known demodulation apparatus, the shift register 2, the logic circuit 3 and the latch 4 must operate at the speed of the above described transmitted digital signal a'. Implementation of these circuits by using CMOS circuits or the like thus becomes difficult, and expensive high-speed devices such as ECL must be used, resulting in problems in LSI implementation and power consumption.

SUMMARY OF THE INVENTION

An object of the present invention is to provide a demodulation apparatus capable of demodulating digital signals at high speed by using circuits operating at relatively low speeds.

In accordance with a feature of a preferred embodiment of the present invention, a demodulation apparatus for either the Miller-squared code signal or the Miller code signal comprises serial-to-parallel conversion means for performing serial-to-parallel conversion (S-P conversion) upon a received signal (or a reproduced signal) to produce n-phase parallel signals, means for generating n-phase virtual demodulated signals on the basis of the above described parallel signals, phase detection means for detecting a specific pattern phase of the above described parallel signals, and means for selecting demodulated data out of the above described n-phase virtual demodulated signals by means of a selection signal supplied to the above described phase detection means.

Further, n is a positive integer. For the Miller-squared code signal, n is desired to be an even number, but may also be an odd number. When n is an even number, the above described demodulated data selection means selects n/2—phase d' modulated data out of the n-phase virtual demodulated signals. When n is a positive odd number, the demodulated data selection means may alternately select (n+1)/2-phase and (n−1)/2-phase virtual demodulated signals respectively in phase alignment out of the n-phase virtual demodulated signals.

By applying serial-to-parallel conversion to the received signal to produce the n-phase signals and performing the succeeding signal processing at a speed equivalent to 1/n times the seed of the transmission clock, problems of the prior; art are solved.

In the conventional scheme, a virtual demodulated signal is generated at the speed of the transmission clock, and data in phase alignment are selected out of the virtual demodulated signals at the speed of the data clock. On the other hand, in accordance with the present invention, a received signal undergoes serial-to-parallel conversion to produce n-phase signals by the above described means and n-phase virtual demodulated signals are simultaneously generated at a speed equivalent to 1/n times the speed of the transmission clock so that a plurality of demodulated data may be selected out of the n-pase virtual demodulated signals at a speed equivalent to 1/n times the speed of the data clock.

Therefore, the serial-to-parallel conversion circuit needs circuit devices operating at high speed. However, shift registers and logic circuits constituting a major portion of the demodulator can be implemented by using circuit devices operating at low speeds such as CMOS circuits, and power consumption can also be decreased.

DESCRIPTION OF THE PREFERRED EMBODIMENT

Figure 1:
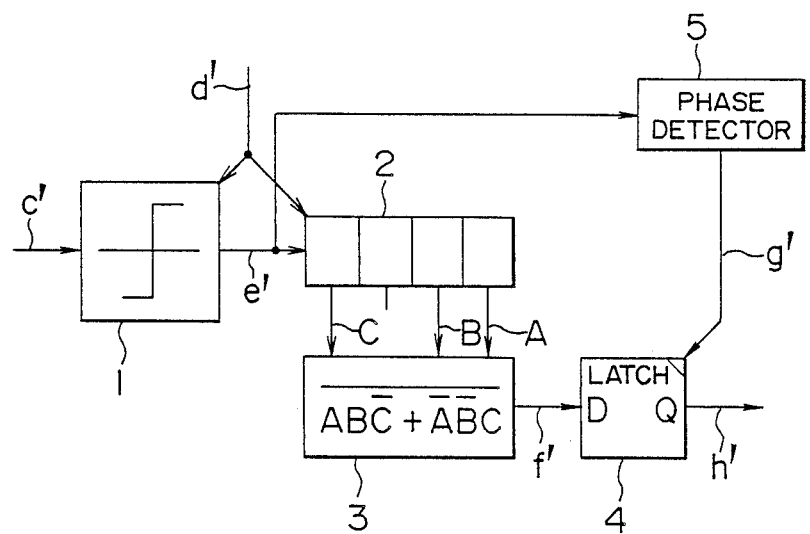
FIG. 1 is a block diagram showing the configuration of a conventional demodulation apparatus.
Figure 2:
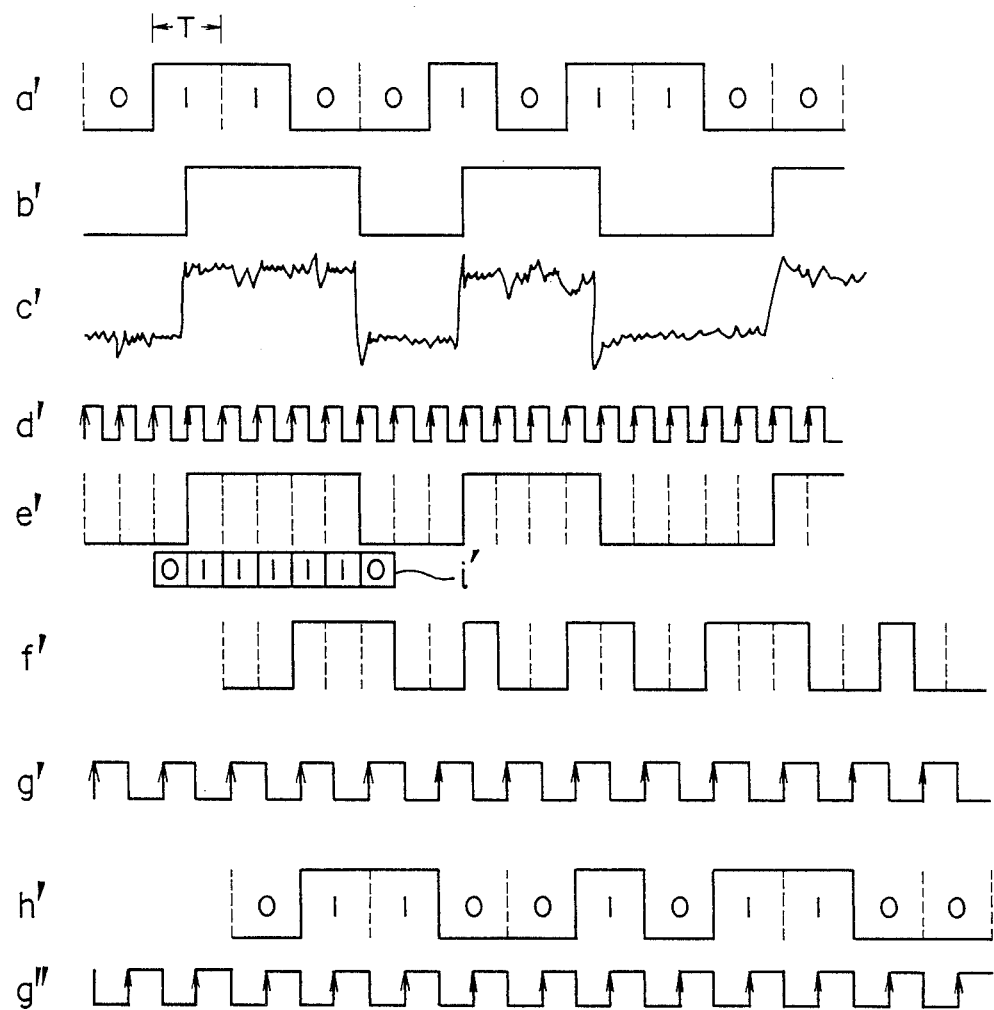
FIG. 2 is a signal diagram for illustrating the operation of the apparatus shown in FIG. 1.
Figure 3:
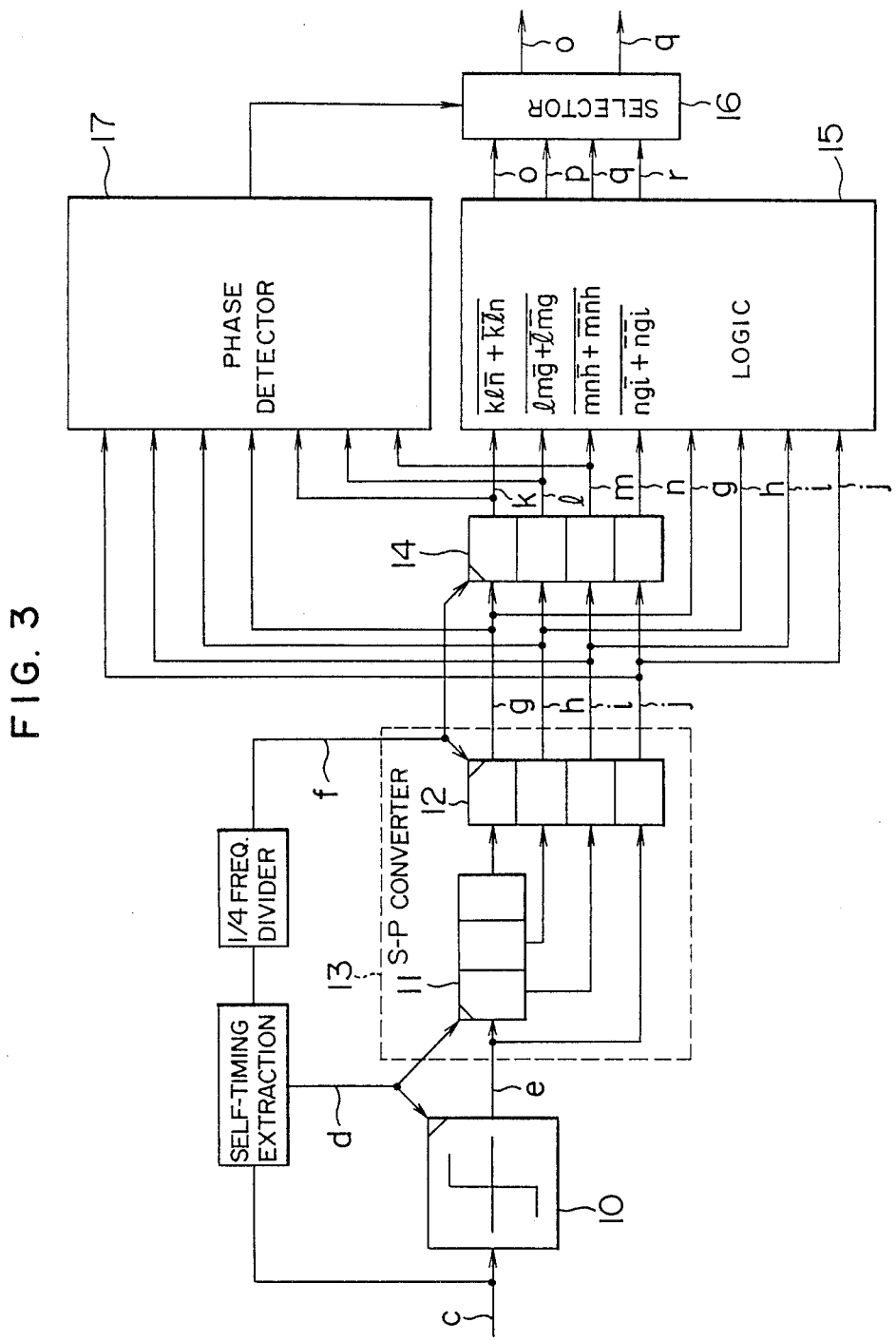
FIG. 3 is a block diagram showing an embodiment of a demodulation apparatus according to the present invention.
Figure 4:
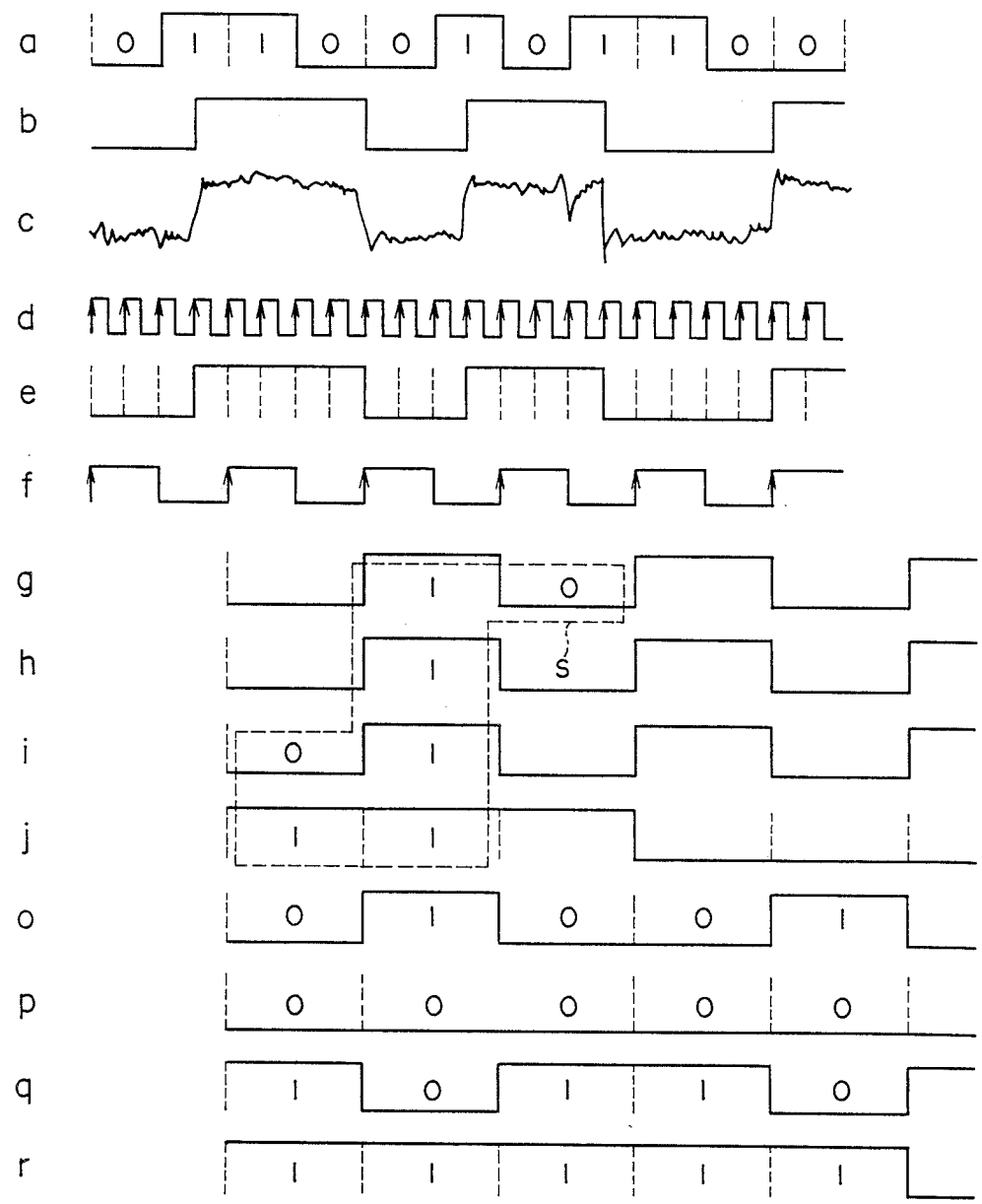
FIG. 4 is a signal diagram for illustrating the operation of the embodiment shown in FIG. 3.

FIG. 3 shows the configuration of an embodiment of a demodulation apparatus according to the present invention. FIG. 4 is time chart of signals at various portions of the above described demodulation apparatus.

A digital signal a to be transmitted (or recorded) is converted to a Miller-squared code signal b and is affected by noises as a result of transmission (or recording), resulting in an illustrated input signal c. This input signal c is converted to a digital signal e by a binary decision circuit 10 in synchronism with a transmission clock d. The transmission clock d is derived from the input signal c by a timing extraction circuit. The digital signal e undergoes serial-to-parallel conversion in a serial-to-parallel conversion circuit 13 comprising a shift register 11 having three latches, which operates in sychronism with the transmission clock d, and a latch 12, which operates in synchronism with a clock f obtained by applying frequency division with a ratio of ¼ to the clock d in a frequency divider. Four-phase parallel signals g, h, i and j are thus generated. A latch 14 operates in synchronism with the ¼-frequency-divided clock f and outputs delayed signals k, l, m and n which are delayed by one clock period as compared with the signals g, h, i and j. A logic circuit 15 performs logical operation $kl\overline{n}+\overline{k}ln$, $lm\overline{g}+\overline{l}mg$, $mn\overline{h}+\overline{m}nh$ and $ng\overline{i}+\overline{n}gi$ as shown within the circuit to generate four-phase virtual demodulated signals o, p, q and r, respectively. In response to a selection signal supplied from a phase detector circuit 17, a selector 16 selects, in this case, two-phase virtual demodulated signals o and q corresponding to n/2 out of four-phase virtual demodulated signals comprising a pair of o and q and a pair of p and r and outputs the two-phase virtual demodulated signals o and q as demodulated data. The two-phase virtual demodulated signals o and q undergo parallel-to-serial conversion to produce the original digital signal. The phase detector circuit 17 detects the phase of a specific pattern s such as (0111110) contained in the four-phase parallel signals g, h, i and j. In case the specific pattern s begins with the phase of g or i, the selector 16 selects two-phase virtual demodulated signals o and q corresponding to n/2 as demodulated data out of the four-phase virtual demodulated signals o, p, q and r. In case the specific pattern begins with h or j, the selector 16 selects p and r as demodulated data. As shown in FIG. 4, the specific pattern s begins with the signal i. Therefore, the selector 16 selects the signals o and q. In case of FIG. 4, two-phase signals $\bar{o}$ and q are outputted, and hence the output ($\bar{o}$, q) appearing at intervals of the period of the clock f becomes (0, 1), (1, 0), (0, 1), (0, 1), (1, 0) and so on. By applying parallel-to-serial conversion to this output, the same signal as that of the original signal a shown in FIG. 4 is obtained.

In the embodiment heretofore described, the pattern "0111110" has been shown as an example of the specific pattern s. However, the specific pattern is not restricted to this pattern, but may be "1000001" having polarities opposite to those of the above described pattern. Further, it is possible to use a specific pattern "01111110" (3T), which is generated when the original digital signal is "01101", and a pattern "10000001" having opposite polarities thereto. It is also possible to use a pattern "011110" (2T), which is gererated when the original digital signal is "0101 - - - - - - ", and "100001". As the specific pattern in case the transmitted signal is a Miller code signal, only "011110" (2T) and "100001" among a plurality of patterns can be used.

Further, in the above described embodiment, the case where the number n of phases forming the unit of the serial-to-parallel conversion is a positive even number has been described. However, n may be set at a positive odd number. In this case, however, it is necessary to select alternately the virtual demodulated signals of (n+1)/2 phases and the virtual demodulated signals of (n−1)/2 phases respectively in phase alignment out of n-phase virtual demodulated signals.

As heretofore described, the present invention solves the problem that high speed devices such as ECL must be used by applying n-phase (where n is a positive even number) serial-to-parallel conversion (S-P conversion) to a received signal (or a reproduced signal) in the demodulation scheme for either Miller-squared code signal or Miller code signal and performing the succeeding signal processing at a speed equivalent to 1/n times that of the clock of the received signal (or the reproduced signal).

We claim:

1. A demodulation apparatus comprising:
   serial-to-parallel conversion means for converting a Miller-squared code signal or a Miller code signal supplied as a serial signal to parallel signals;
   first means for deriving n-phase virtual demodulated signals from said parallel signals;
   phase detection means for detecting phase information from a specific pattern of said parallel signals; and
   selection means for selecting n/2-phase virtual demodulated signals out of n-phase virtual demodulated signals in response to said phase information.

2. A demodulation apparatus according to claim 1, wherein when said serial signal comprises a Miller-squared code signal, said specific pattern comprises at least one of "100001", "0111110", "1000001", "01111110" and "10000001".

3. A demodulation apparatus according to claim 1, wherein when said serial signal comprises a Miller code signal, said specific pattern comprises either one of "011110" and "100001".

4. A demodulation apparatus according to claim 1, wherein said first means and selection means comprise CMOS circuits.

5. A demodulation apparatus according to claim 1, wherein n is 4,
   wherein said serial-to-parallel conversion means comprises:

a shift register for shifting an original digital signal in synchronism with a transmission clock;

a frequency division circuit for generating a clock divided in frequency with a ratio of ¼ as compared with said transmission clock; and first latch means for latching outputs of said shift register in response to said frequency-divided clock and for outputting four-phase parallel signals g, h, i and j, and wherein said first means comprises:

second latch means for outputting delayed signals k, l, m and n obtained by delaying said signals g, h, i and j by one frequency-divided clock; and logic means for performing logical operation $k\overline{ln}+\overline{k}ln$, $l\overline{mg}+\overline{l}mg$, $mn\overline{h}+\overline{mn}h$ and $ng\overline{i}30\ \overline{ng}i$ upon said signals g, h, i, k, l, m and n to generate virtual demodulated signals o, p, q and r, respectively.

6. A demodulation apparatus according to claim 5, wherein said phase detection means detects occurrence of the specific pattern from outputs of said first and second latch means.

* * * * *